(12) United States Patent
Itokawa et al.

(10) Patent No.: US 8,729,607 B2
(45) Date of Patent: May 20, 2014

(54) NEEDLE-SHAPED PROFILE FINFET DEVICE

(75) Inventors: Hiroshi Itokawa, Malta, NY (US);
Akira Hokazono, Clifton Park, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/595,022

(22) Filed: Aug. 27, 2012

(65) Prior Publication Data

US 2014/0054648 A1  Feb. 27, 2014

(51) Int. Cl.
*H01L 29/76* (2006.01)
*H01L 29/78* (2006.01)

(52) U.S. Cl.
CPC .................................. *H01L 29/7853* (2013.01)
USPC ........... 257/213; 257/288; 257/623; 257/618; 257/E29.003; 257/E21.619; 438/197; 438/198

(58) Field of Classification Search
CPC ............ H01L 29/7856; H01L 29/7853; H01L 29/7854; H01L 29/7855
USPC .......... 257/213, 623–628, E29.003; 438/197, 438/198, 478
See application file for complete search history.

(56) References Cited

U.S. PATENT DOCUMENTS

| 7,915,693 B2 | 3/2011 | Okano | |
| 2007/0034972 A1* | 2/2007 | Chau et al. | 257/401 |
| 2010/0164048 A1* | 7/2010 | Figuet et al. | 257/458 |
| 2011/0193141 A1* | 8/2011 | Lin et al. | 257/255 |
| 2012/0115284 A1* | 5/2012 | Chien et al. | 438/157 |

OTHER PUBLICATIONS

Clarke, Peter. Intel's FinFETs are less fin and more triangle. May 17, 2012. www.eetimes.com.*

* cited by examiner

*Primary Examiner* — Julio J Maldonado
*Assistant Examiner* — Molly Reida
(74) *Attorney, Agent, or Firm* — White & Case LLP

(57) ABSTRACT

Structures and methods are presented relating to formation of finFET semiconducting devices. A finFET device is presented comprising fin(s) formed on a substrate, wherein the fin(s) has a needle-shaped profile. The needle-shaped profile, in conjunction with at least a buffer layer or a doped layer, epitaxially formed on the fin(s), facilitates strain to be induced into the fin(s) by the buffer layer or the doped layer. The fin(s) can comprise silicon aligned on a first plane, while at least one of the buffer layer or the doped layer are grown on a second plane, the alignment of the first and second planes are disparate and are selected such that formation of the buffer layer or the doped layer generates a stress in the fin(s). The generated stress results in a strain being induced into the fin(s) channel region, which can improve electron and/or hole mobility in the channel.

18 Claims, 6 Drawing Sheets

NEEDLE-SHAPED PROFILE FINFET DEVICE

FIELD

Embodiments described herein relate generally to structures and methods for formation of a Fin-FET semiconductor device comprising a fin having a modified profile.

BACKGROUND

Fin field effect transistors (finFET) comprise a narrow source-channel-drain region (the fin) about which is formed a gate. Activation of the gate facilitates mobility of electron(s) or hole(s) in the channel between the source and the drain thereby facilitating operation of the finFET. An issue with finFET devices concerns controlling, from structures adjacent to the channel, diffusion of dopants and/or impurities, into the channel which accordingly affect electron/hole mobility in the channel and hence may deleteriously affect anticipated operation of the channel. For example, a high concentration of dopants/impurities in the channel can cause the channel threshold voltage (Vth) to drift away (i.e., increase or decrease) from an anticipated target Vth for the channel.

Further, to facilitate operation of a finFET device, the application of strain stressors to the gate/channel region may be desired to facilitate improved/controlled electron/hole mobility. However, owing to the placement of sidewalls on either side of the gate/channel it can be difficult to apply stressors that will generate the desired strain in the channel to facilitate the required level of electron/hole mobility.

With reference to FIG. 6, presented is a rudimentary depiction of a finFET device comprising a semiconductor substrate on which is formed a fin, around which is further formed a gate. As shown in FIG. 6, a semiconductor substrate (e.g., a Si-containing structure) 210 has formed thereon a fin 220, where the fin 220 has a source side (as indicated) and a drain side (not shown), with an isolating layer 240 further formed thereon. A gate 250 is formed over an isolating layer 240, with spacers 260 formed on the sidewalls of the gate 250, and an insulating layer 270 further formed thereon. Element isolating layer 240 can be deposited as part of a process associated with formation of fin 220, where in an aspect, element isolating layer 240 can comprise of any suitable material, such as a high aspect ratio process (HARP) oxide layer. As known in the art, the region of the fin 220 which is enclosed by gate 250 can act as a channel (not shown) between a source region and a drain region of the fin.

In a typical arrangement, as illustrated in FIG. 6, a doped epitaxial layer 290 can be formed in an attempt to generate strain in the gate 250 and isolating layer 240. The doped epitaxial layer 290 can comprise of silicon germanium compound (SiGe) or carbon-doped silicon (Si:C).

In another typical arrangement, as illustrated in FIGS. 7 and 8, to facilitate increasing the inducement of strain in the channel, the isolating layer (ref. with the element isolating layer 240 shown in FIG. 6) can be reduced such that it is confined to the region of the gate. As shown in FIGS. 7 and 8, fin(s) 320 are formed on substrate 310, with isolation region 340 and gate 350 formed thereon, with gate 350 being enclosed in spacer(s) 360 and insulating layer 370. By reducing the size of the isolating layer 340 so that it is confined to the region of the gate 350, is it possible to deposit doped epitaxial layer 390 to reside on increased areas (in comparison with the structure shown in FIG. 6) of fin(s) 320, and isolating layer 340 under gate 350. However, as shown in FIG. 8, such an approach can lead to deleterious effects such as junction leakage, junction capacitance, and off current pathways being encountered, owing to, for example, dopant migration from doped epitaxial layer 390 into substrate 310. To prevent such deleterious effects a buffer layer comprising dopant diffusion stopper is required.

Hence, another approach is to utilize a buffer layer between the substrate and the doped epitaxial layer. FIGS. 9 and 10a-c illustrate such an approach, where FIGS. 10a-c provide a view of a portion of the structure shown in FIG. 9, along direction X. As shown in FIG. 9, fin(s) 420 are formed on substrate 410, with isolation region 440 and gate 450 formed thereon, with gate 450 being enclosed in spacer(s) 460 and insulating layer 470. By reducing the size of the isolating layer 440 so that it is confined to the region of the gate 450, is it possible to deposit buffer epitaxial layer 495 to reside on fin(s) 420, and also to be located against isolating layer 440 under gate 450. However, as shown in FIGS. 9 and 10a-c, such an approach can lead to portions of buffer epitaxial layer 495 being deposited on to the upper surface E of fin(s) 420 which can impede the formation of doped epitaxial layer 490, as the doped epitaxial layer 490 is formed on the buffer epitaxial layer 495 located on the top of fin(s) 420.

In an aspect, the planer direction of the fin 420 is {001}, while stress from the buffer epitaxial layer 495 and the doped epitaxial layer 490 is in the {100} plane on the horizontal surfaces F and E and in the {110} plane on the vertical surfaces C and D. Hence, it is not possible to apply the {100} planar stress or the {110} planar stress on the fin in a truly combined manner to facilitate maximal stress (and according strain) being applied to the fin channel region, the stress transitions from being effectively 100% in the {110} plane and 0% in the {100} plane at the base of fin 420 through to being effectively 100% in the {100} plane and 0% in the {110} plane at the top surface E of fin 420. Thus, the stress throughout fin 420 is not of a consistent value or in a consistent direction.

Hence, as illustrated in FIGS. 6-10a-c, the ability to form an epitaxial layer such that the epitaxial layer provisions a desired degree of strain in any of the fin, channel, gate, or isolating layer can be difficult.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments in a simplified form as a prelude to the more detailed description of the various embodiments that follow.

The subject innovation presents various techniques related to formation of finFET semiconducting devices. In an exemplary, non-limiting embodiment, structures and methods are presented to facilitate formation of a finFET device comprising at least one fin grown on a substrate, where the fin has a needle-shaped profile. The needle-shaped profile, in conjunction with epitaxial growth of at least a buffer layer or a doped layer, formed on the fin, facilitates strain to be induced into the fin by at least one of the buffer layer or the doped layer. A second fin can be formed on the substrate with a trough formed between the first fin and the second fin. The silicon substrate, the first fin, and the second fin can comprise silicon aligned on a first plane, while at least one of the buffer layer or the doped layer are grown on a second plane, wherein the alignment of the first plane and the second plane are disparate, the first plane and second plane are selected such that formation of at least one of the buffer layer or the doped layer generates a stress in at least one of the substrate, first fin, or second fin. The generated stress results in a strain being induced into the channel region of the fin, which can improve electron and/or hole mobility in the channel.

In an exemplary, non-limiting embodiment, the at least one of the substrate, first fin, or second fin are formed with a crystal plane alignment of {001}, while at least one of the buffer layer or the doped layer are epitaxially formed with a crystal plane alignment of {100} or {110}.

In an exemplary, non-limiting embodiment, where the finFET device is operating as a nMOSFET device, the bottom filled buffer layer can comprise of a carbon-doped silicon layer (Si:C) having selective epitaxy. In a further exemplary, non-limiting embodiment, where the finFET device is operating as a pMOSFET device, bottom filled buffer layer can comprise of a SiH$_4$-based SiGe or SiGeC layer having selective epitaxy. In a further exemplary, non-limiting embodiment, where the finFET device is operating as a nMOSFET device, the doped layer can comprise of group V element such as phosphorus-doped silicon (P-doped Si, Si:P) which has selective epitaxy. In another exemplary, non-limiting embodiment, where the finFET device is operating as a pMOSFET device, the doped layer can comprise of a group III element such as silicon-germanium-boron (SiGeB) compound or can comprise of a silicon-germanium-boron-carbon (SiGeBC) compound, where the SiGeB and SiGeBC layers have selective epitaxy.

DETAILED DESCRIPTION

The subject innovation presents various techniques relating to forming a stress inducing layer as part of formation of a finFET device, where the layer is deposited in such a manner as to induce a desired degree of stress (and according strain) in a fin, a gate, or an isolating region. In contrast with the various conventional approaches illustrated in FIGS. 6-10, the various systems and methods presented herein utilized a modified profile for each fin region which acts to maximize the ability for a subsequently formed layer to induce strain into at least one of the fin, channel, gate, or an isolating region. For example, by placing a stressor on a source and/or drain region of a fin, a corresponding degree of strain can be generated in the channel region of the fin, e.g., where the channel resides under the gate. Accordingly, if required, the strain induced into the channel region can be transferred to the gate or the isolating region, hence, while only a drain and/or a source region of a fin is being placed under stress, an associated strain can be conveyed to an associated/adjacent region/structure such as a channel, gate, isolating layer, etc.

A Needle-Profile Fin for Enhancing Stress in the Fin

FIGS. 1-4 illustrate a series of exemplary, non-limiting embodiments to facilitate formation of a fin(s) having a needle-shaped profile to facilitate conveyance of a required stress and associated strain in a finFET device.

Figure 1:
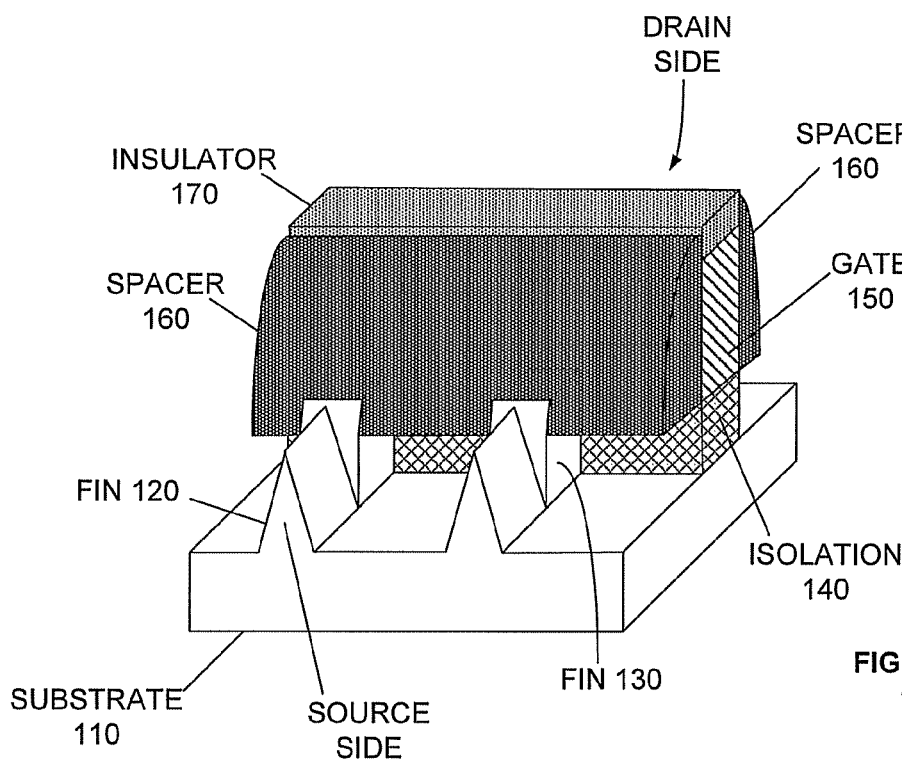
FIG. 1 is a block diagram illustrating a non-limiting, exemplary embodiment of a structure comprising a finFET device having needle-profiled fin.

FIG. 1 illustrates a rudimentary depiction of a finFET device comprising a semiconductor substrate on which is formed a fin, around which is further formed a gate. As shown in FIG. 1, a semiconductor substrate (e.g., a Si-containing structure) 110 has formed thereon a fin(s) 120, where the fin 120 has a source side (as indicated) and a drain side (not shown), with an insulating film 140 further formed thereon. A gate 150 is formed over the isolating region 140, with gate 150 being enclosed in spacer(s) 160 and insulating layer 170 (e.g., tetraethyl orthosilicate (TEOS)). As known in the art, the region of the fin(s) 120 which is enclosed by gate 150 can act as a channel (not shown) between a source region and a drain region of the fin. Element isolating region 140 can be deposited as part of a process associated with formation of fin(s) 120, where in an aspect, element isolating layer 140 can comprise of any suitable material, such as a high aspect ratio process (HARP) oxide layer. In comparison with the approaches presented in FIGS. 6-10, utilizing a fin(s) having a needle-shaped profile maximizes the induced channel strain as the entire source and drain region of fin(s) 120 is available. In an exemplary, non-limiting embodiment, formation of the needle-profile fin(s) 120 can be performed after formation of gate 150, spacers 160, etc. As shown in FIG. 1, a portion of the fin, fin 130, under the gate has a square/rectangular profile which is an artifact of a conventional fin forming operation. Fin 130, in region fin 120, can be subsequently modified to form the needle-shaped profile, as illustrated.

Figure 2:
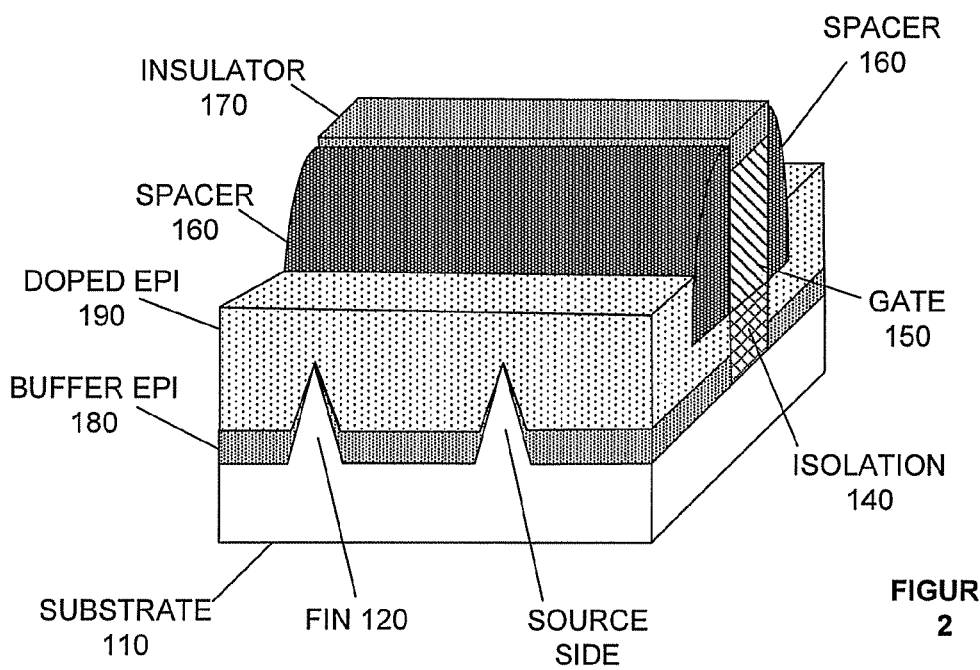
FIG. 2 is a block diagram illustrating a non-limiting, exemplary embodiment of a structure comprising a finFET device having needle-profiled fin.
Figure 3:
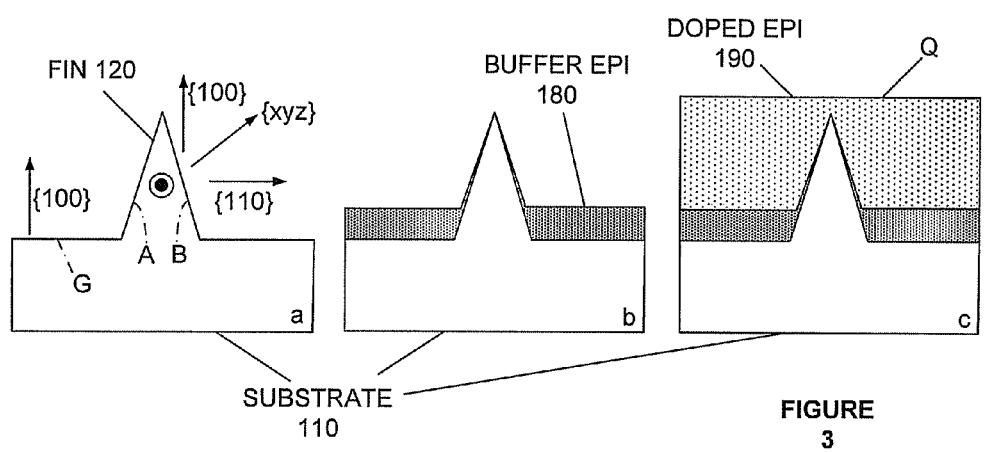
FIG. 3a is a block diagram illustrating a non-limiting, exemplary embodiment of a structure comprising a finFET device having needle-profiled fin.
FIG. 3b is a block diagram illustrating a non-limiting, exemplary embodiment of a structure comprising a finFET device having needle-profiled fin.
FIG. 3c is a block diagram illustrating a non-limiting, exemplary embodiment of a structure comprising a finFET device having needle-profiled fin.
Figure 4:
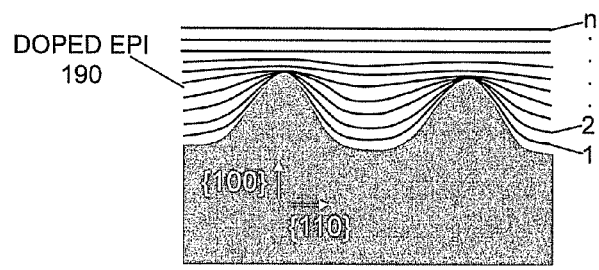
FIG. 4 is a block diagram illustrating a non-limiting, exemplary embodiment of a structure comprising a finFET device having needle-profiled fin.

Turning to FIG. 2, an epitaxially (epitaxial—epi) formed buffer epi layer 180 is formed over the fin(s) 120 and the upper surface of substrate 110, where the buffer epi layer 180 is formed to extend to adjoin a portion of isolating layer 140. Formed over the buffer epi layer 180 is an epitaxially formed doped epi layer 190. As shown in FIGS. 3a-c, owing to only a small layer of buffer epi layer 180 being formed on the sides (FIG. 3a, sidewalls A and B) the doped epi layer 190 is formed in the troughs between a pair of respective fins. The layering effect of the buffer epi layer 180 and the doped epi layer 190 is schematically represented in FIG. 4, with respective layers of buffer epi layer 180 and doped epi layer 190 being built up from layer 1, layer 2, through to layer n, where layer n has a flat profile (e.g., surface Q of doped epi layer 190 shown in FIG. 3c) in comparison with the non-flat profile of doped epi layer 490, surface P as shown in FIG. 10c. It is to be appreciated that while FIG. 4 depicts a layered formation of buffer epi layer 180 (e.g., layers 1 and 2 being formed in a 'bottom filled' manner) and doped epi layer 190 (remaining layers thru n), such a layered formation is presented to facilitate understanding of the growth of buffer epi layer 180 and/or doped epi layer 190 and rather than buffer epi layer 180 and/or doped epi layer 190 being formed as a series of 'layers', the formation of buffer epi layer 180 and/or doped epi layer 190 can be of a continuous formation, e.g., a continuous deposition of buffer epi layer 180 and/or doped epi layer 190.

In an exemplary, non-limiting embodiment, where the finFET device is operating as a nMOSFET device, doped epi layer 190 can comprise of group V element such as phosphorus-doped silicon (P-doped Si, Si:P) which has selective epitaxy. In another exemplary, non-limiting embodiment, where the finFET device is operating as a pMOSFET device, doped epi layer 190 can comprise of a group III element such as silicon-germanium-boron (SiGeB) compound or can comprise of a silicon-germanium-boron-carbon (SiGeBC) compound, where the SiGeB and SiGeBC layers have selective epitaxy. In a further exemplary, non-limiting embodiment, where the finFET device is operating as a nMOSFET device, the bottom filled buffer epi layer 180 can comprise of a carbon-doped silicon layer (Si:C) having selective epitaxy. In a further exemplary, non-limiting embodiment, where the finFET device is operating as a pMOSFET device, bottom filled buffer epi layer 180 can comprise of a SiH$_4$-based SiGe or SiGeC layer having selective epitaxy. Owing to the various dopants (e.g., Ge, C, B, P, etc.) the Si crystal structure is strained to accommodate the one or more dopants and hence where a buffer epi layer and/or a doped epi layer are formed epitaxially on the Si fin then the dopant(s) can exert in the epitaxial layers can exert stress, and corresponding strain, on the Si fin which can be transferred to the channel region of the fin.

In an exemplary, non-limiting formation process, the operating conditions for formation of the buffer epi layer 180 and/or the doped epi layer 190 can be controlled to facilitate growth of the layer in a preferred direction or other. For example, under processing conditions of 5 Torr, at 595° C. a layer having a thickness of 22.8 nm in the miller index {100} direction and a thickness of 1.8 nm in the {110} direction can be formed. Alternatively, under processing conditions of 10 Torr, at 591° C. a layer having a thickness of 8.3 nm in the {100} direction and a thickness of 5.6 nm in the {110} direction can be formed. Thus is it possible to utilize low pressure operating conditions to facilitate preferential growth in a particular planar direction, and higher pressure operating conditions to facilitate preferential growth in another direction. Hence, in an exemplary, non-limiting embodiment, the buffer epi layer 180 can be formed with growth in a direction similar to that of the underlying silicon substrate 110 while the doped epi layer 190 can be grown preferentially in a different direction, thereby still being grown epitaxially but exerting strain on the underlying fin. It is to be appreciated that the previously presented process conditions are exemplary and any processing conditions to facilitate formation of a layer having a desired thickness in a particular planar direction (e.g., {100}, {110}) is suitable for application with the various embodiments presented herein.

In another exemplary, non-limiting embodiment, it is possible to combine gradient doping with preferential growth. For example, to prevent device punch through, the buffer epi layer 180 can be formed in a 'bottom-filled' manner where the buffer epi layer 180 comprises a low volume of dopant, or no volume of dopant, while the doped epi layer 190 comprises a high volume of dopant. With such a structure the buffer epi layer 180 acts to prevent dopant migration from the doped epi layer 190 to the substrate 110.

Further, as previously mentioned, with a fin formed by a conventional process, owing to the upper surface E (reference FIG. 10a) having a pronounced dimension, effectively a stress is applied in the direction {100}, while stress in the plane {100} direction is also applied to surface F of substrate 410, and owing to the vertical/near-vertical sides, e.g., sides C and D of fin 420, FIG. 10a, stress is applied in the {110} plane. As described with reference to FIG. 10a, owing to the stresses transitioning from being effectively 100% in the {110} plane and 0% in the {100} plane at the base of fin 420 through to being effectively 100% in the {100} plane and 0% in the {110} plane at the top surface E of fin 420, the stress throughout fin 420 is not of a consistent value or in a consistent direction.

However, as shown in FIG. 3a, while surface G of substrate 110 is subject to stress in the {100} direction, surfaces A and B are subject to stresses in both the {100} direction and the {110} owing to there being no upper surface to fin 120 (e.g., in comparison with surface E of substrate 410, FIG. 10a) and the non-vertical sides A and B of fin 120 (e.g., in comparison with the vertical/near-vertical surfaces D and C substrate 410, FIG. 10a). Hence, while Si substrate 110 is grown having a preferred crystal plane of {001} the buffer epi layer 180 and/or the doped epi layer 190 can be formed to maximize the strain in either, or both, of planes {100} and {110}, or a fixed combination thereof. For example, owing to the {100} stress and {110} stress both acting on a common surface, either side A or side B, the degree of stress, e.g., a stress vector acting on a plane based on the magnitude of the {100} stress and the magnitude of the {110} stress, the combined stress vector in plane {xyz} can be acting across the whole of side A and/or side B with a consistent magnitude.

Furthermore, the length of fin 120, sides A and B, in comparison with fin 420, sides C and D, owing to them being non-vertical (e.g., sides A and B forming equal length sides of an isosceles triangle) the surface area of sides A and B are greater than the surface area of sides C and D which owing to buffer epi layer 180 and doped epi layer 190 being respectively formed in an epitaxial manner on sides A and B a greater degree of stress can be applied to the sides A and B in comparison with the lesser surface area sides C and D.

In a further exemplary, non-limiting embodiment, growth of buffer epi layer 180 on surfaces A and B of fin 120 can be suppressed owing to the minimal thickness of buffer epi layer 180 on surfaces A and B of fin 120. The suppressed growth enables control of the degree of stress applied by the bottom-filled buffer epi layer 180 on fin 120.

It is to be appreciated that while an exemplary group III element presented herein is boron, the embodiments are equally applicable to any other element such as group III elements aluminum (Al), indium (In), gallium (Ga), etc. Further, while an exemplary group V element presented herein is phosphorus, the embodiments are equally applicable to any other group V elements such as arsenic (As), antimony (Sb), etc.

Figure 5:
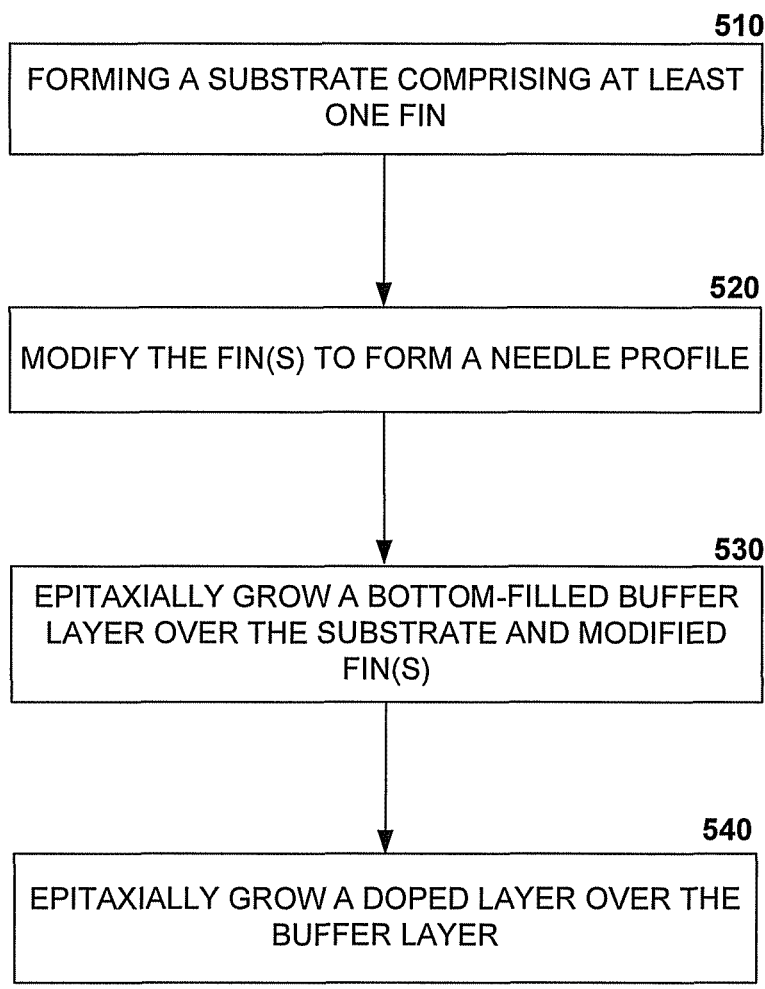
FIG. 5 is a flow diagram illustrating forming a finFET device comprising a needle-profile fin according to a non-limiting, exemplary embodiment.
Figure 6:
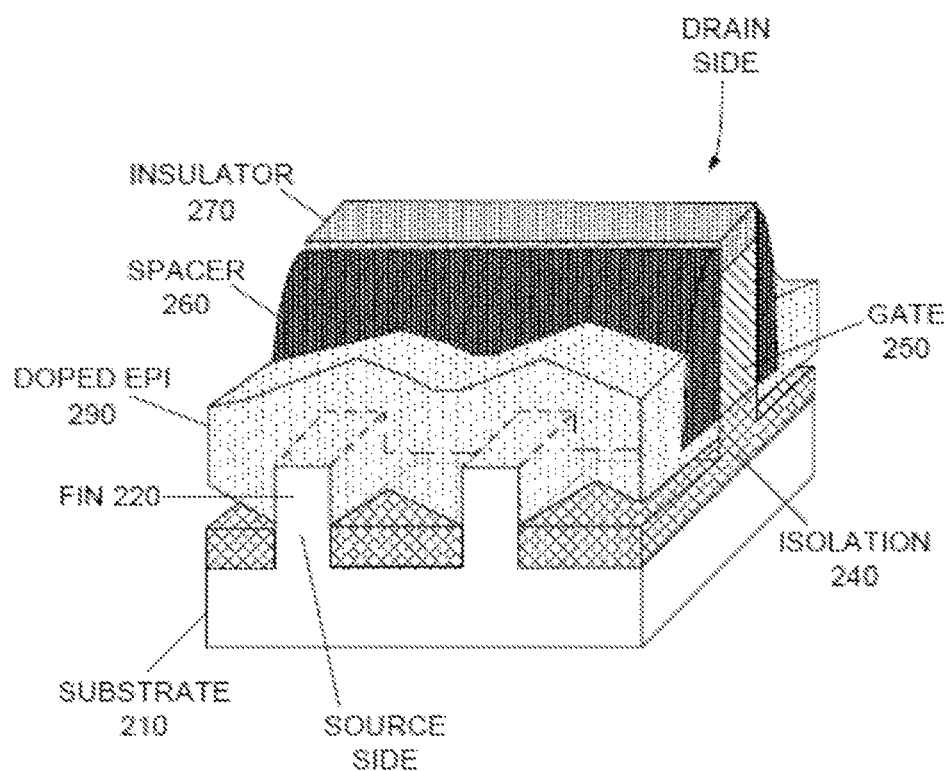
FIG. 6 illustrates a structure comprising a finFET device.
Figure 7:
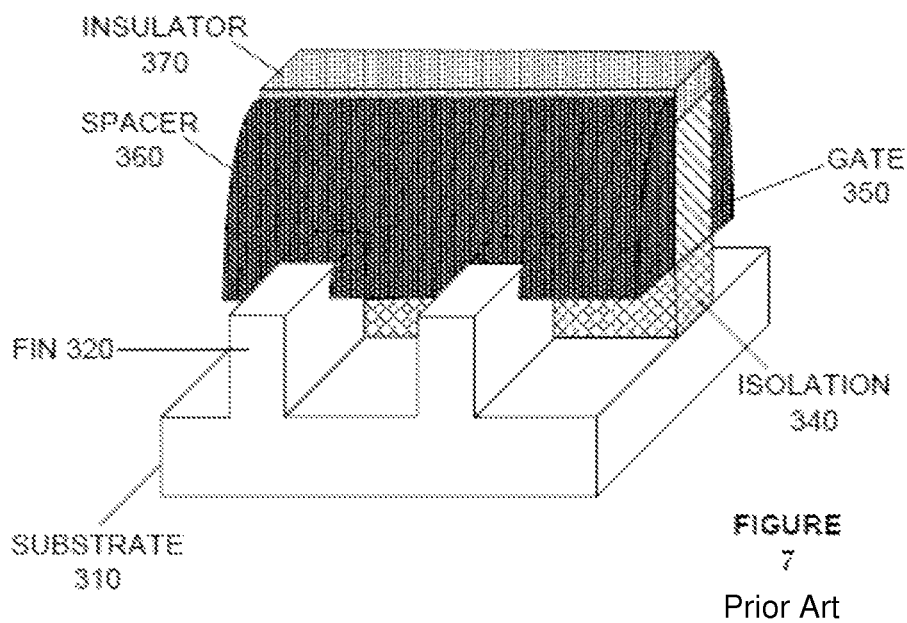
FIG. 7 illustrates a structure comprising a finFET device.

FIG. 5 presents a flow diagram illustrating an exemplary, non-limiting embodiment to facilitate formation of a finFET device comprising at least one fin, where the fin has a needle profile to facilitate stressing of the fin and associated structures.

At 510 a substrate is formed. The various embodiments presented herein are applicable to any finFET structure where it is desired to form a fin having a needle-shaped profile, and further, apply a strain to the fin. In an exemplary, non-limiting embodiment, the first layer comprises a silicon substrate (e.g., Si substrate 110). As part of the formation process, the substrate can be further processed to form one or more fins (e.g., fin 130) as known in the art for constructing a finFET structure. For example, shallow trench isolation (STI) and recessing operations form the one or more fins. Well implantation is performed, followed by gate stack formation and patterning, spacer formation and optional extension patterning, followed by local isolations formed in the source/drain regions being recessed.

At 520, the fin profile is modified. Rather than leaving the fin (e.g., fin 130) with a profile having vertical/near-vertical sides (e.g., fin 220, 320, 420), for example resulting from a conventional fin forming operation, the fin profile is further modified. The fin can be modified to have a profile which renders the fin amenable to application of a stress which accordingly conveys a strain to the channel region of the fin, such a profile is a needle-shaped profile (e.g., as illustrated with fin 120). Modification of the fin can be by any suitable technique such as reactive-ion etching (RIE) or wet etch treatment, for example.

Figure 8:
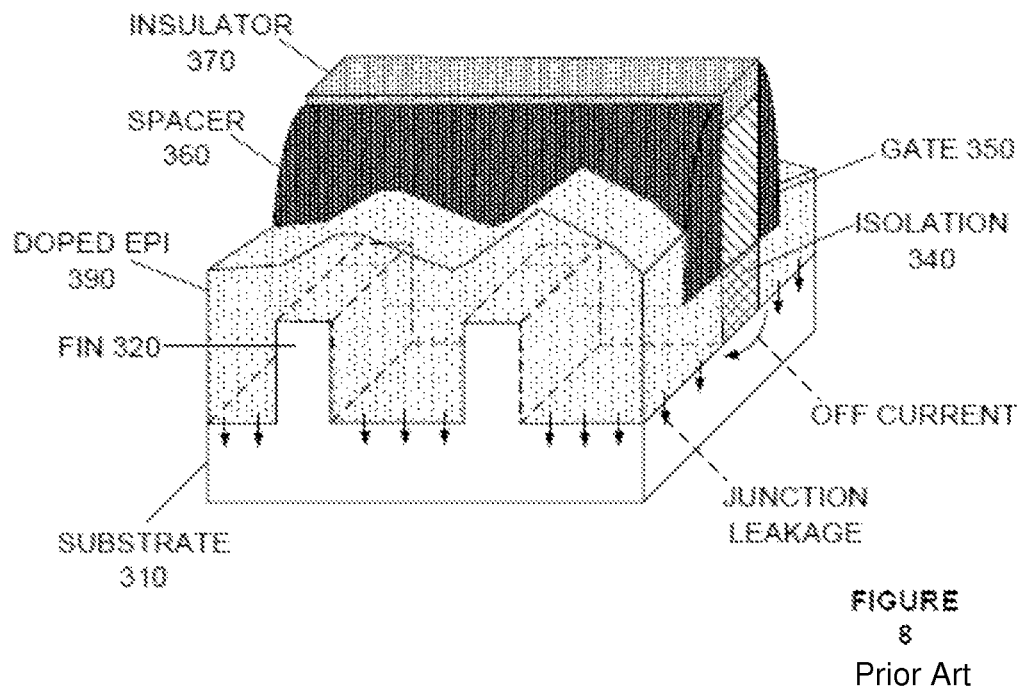
FIG. 8 illustrates a structure comprising a finFET device.
Figure 9:
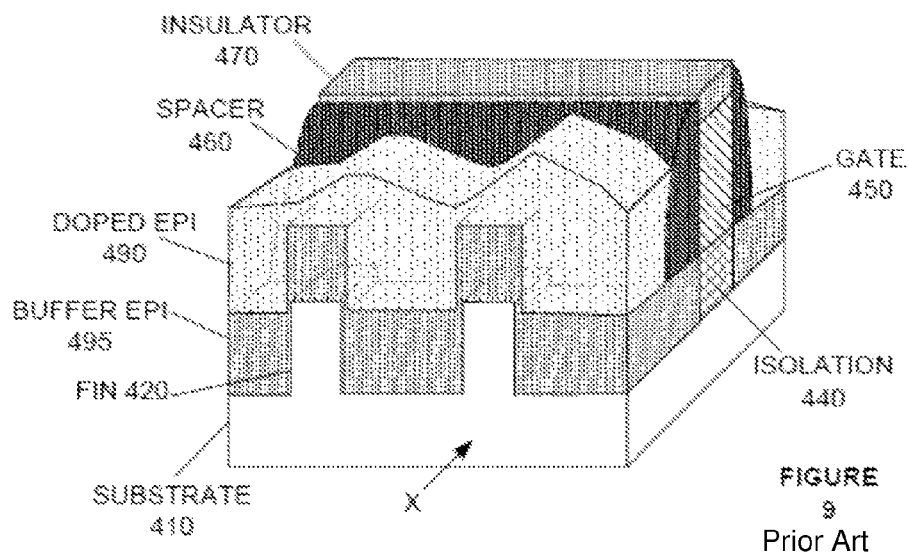
FIG. 9 illustrates a structure comprising a finFET device.
Figure 10:
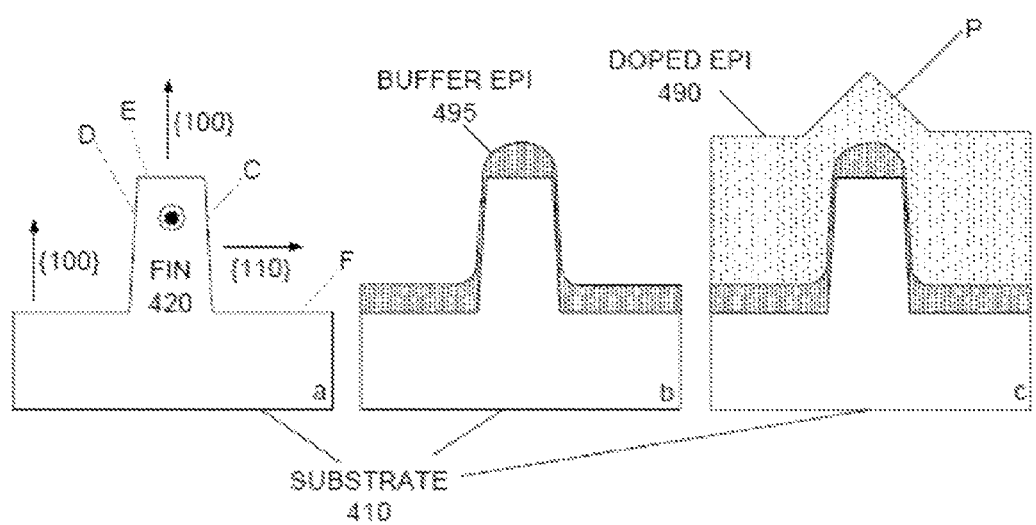
FIG. 10a illustrates a structure comprising a finFET device.
FIG. 10b illustrates a structure comprising a finFET device.
FIG. 10c illustrates a structure comprising a finFET device.

At 530, a buffer layer is formed in the trough formed between the fin and an adjacent fin. A buffer layer (e.g., buffer layer 180) can be formed in the trough between the fin and an adjacent fin, where the buffer layer can act to isolate the substrate from any layer subsequently formed on the buffer layer and thus negate deleterious effects such as junction leakage, junction capacitance, and off current pathways, owing to, for example, dopant migration from the subsequently formed layer (e.g., an effect as shown in FIG. 8). The buffer layer can be selectively grown epitaxially onto the substrate and fin(s). In an exemplary, non-limiting embodiment, the buffer layer can be grown on a plane that acts to generate stress in the underlying substrate and/or fin(s). For example, the substrate and fin(s) are formed on a {001} plane, while the buffer layer can be formed such that stress is applied to the substrate and/or fin(s) in the {100} plane, the {110} plane, or both.

At 540, a dopant layer is formed over the buffer layer. A doped layer (e.g., layer 190) is grown epitaxially onto the buffer layer. Epitaxial growth of the dopant layer on the buffer layer facilitates transmission of stress to the substrate and/or fin to facilitate generation of strain in the fin and/or substrate region. In accordance with the plane orientation of the buffer layer, the doped layer can be grown such that stress is applied to the substrate and/or fin(s) in the {100} plane, the {110} plane, or both. The combination of a fin having a needle-shaped profile and application of stress thereon by the buffer layer, the doped layer, or combination of both, enables a strained channel region to be formed in the fin (e.g., under gate 150) which can be used to control electron and/or hole mobility in the channel.

In an exemplary, non-limiting embodiment, the buffer layer and the doped layer can be formed to comprise a bilayer epi layer, where the buffer layer is kept lightly doped or nondoped, while the upper doped layer is more heavily doped. And in a further exemplary, non-limiting embodiment, the buffer layer can be grown with negligible growth rate in the {110} direction, with growth in the {100} direction. As previously described, selection of different operating conditions can give rise to layer growth in one direction over another.

General Considerations

It is to be appreciated that the various layers, etc., comprising any of the finFET structures presented herein are simply presented to facilitate understanding of the various exemplary, non-limiting embodiments, and application of the exemplary, non-limiting embodiments is not limited to application with finFET structures comprising layers presented herein, but rather can be utilized with any finFET structure configuration applicable to the exemplary, non-limiting embodiments. For example, while the following embodiments are presented with regard to elements such as boron, phosphorus, etc., the embodiments are equally applicable to any dopant/impurity applicable to operation of nMOS and pMOS finFET devices.

It is to be further appreciated that while the various exemplary embodiments presented herein relate to the substrate and fin(s) being formed on a {001} plane, while the buffer layer and/or the doped layer being formed such that stress is applied to the substrate and/or fin(s) in the {100} plane, the {110} plane, or both, any plane of growth and stress/strain is applicable to the various exemplary embodiments.

The various layers presented in the foregoing can be formed/deposited by any suitable process such as a thermal processing, phase conversion, spin coating, deposition, CVD process, for example, low pressure chemical vapor deposition (LPCVD), plasma enhanced chemical vapor deposition (PECVD), molecular-beam epitaxy (MBE), liquid-phase epitaxy (LPE), vapor-phase epitaxy (VPE), solid-phase epitaxy (SPE), deposition doping, etc.

Any suitable technique can be used to pattern any of the material layers presented herein. For example, patterning can be created by employing a photoresist which is patterned using standard photolithographic techniques to form the required pattern to create the pattern, fin, trench, opening, etc., wherein the photoresist is exposed to electromagnetic radiation through a mask having an image pattern of a desired layout (e.g., fins, desired trenches, etc.).

Etching can be by any etching/material removal technique that is applicable to the various embodiments, as described herein. For example, a wet or dry etching technique can be employed for patterning, while in another aspect, etching can be by a specific anisotropically etch. Etching can be utilized to remove a particular layer where a given layer may be susceptible to etch by a particular etchant while a neighboring layer is not. In another example, anisotropic etching techniques can be utilized to control material removal in a specific direction (unlike standard wet etching) such as vertically down into a stack to form a fin, an opening, etc.

Leveling of layers after formation can be by any suitable technique, e.g., by chemical mechanical polish/planarization (CMP) or other suitable process, to achieve a given dimension, in preparation for the next stage in creation of the replacement gate/contact structure, etc.

It is to be appreciated that while a finFET having a needle-shaped profile is utilized in conjunction with a buffer layer and a dopant layer is described, there may be certain procedures that are not fully disclosed during description of the various embodiments as presented herein. However, rather than provide description of each and every operation involved in the various operations facilitating formation, patterning, removal, etc., of each structure presented herein, for the sake of description only the general operations are described. Hence, while no mention may be presented regarding a particular operation pertaining to aspects of a particular figure, it is to be appreciated that any necessary operation, while either not fully disclosed, or not mentioned, to facilitate formation/deconstruction of a particular layer/element/aspect presented in a particular figure is considered to have been conducted. For example, while no mention may be made regarding a layer described in a preceding figure being leveled (e.g., by chemical mechanical polish, or other suitable operation) it is considered, for the sake of readability of the various exemplary embodiments presented herein, that the leveling process occurred, as have any other necessary operations. It is appreciated that the various operations, e.g., leveling, chemical mechanical polish, patterning, photolithography, deposition, layer formation, etching, etc., are well known procedures and are not necessarily expanded upon throughout this description.

The claimed subject matter has been described with reference to the drawings, wherein like reference numerals are used to refer to like elements throughout. In the description, for purposes of explanation, numerous specific details are set forth in order to provide a thorough understanding of the claimed subject matter. It may be evident, however, that the claimed subject matter may be practiced without these specific details. In other instances, well-known structures and devices may be shown in block diagram form in order to facilitate describing the claimed subject matter.

It is to be appreciated that the various Figures illustrating the various embodiments presented herein are simply rendered to facilitate understanding of the various embodiments. Accordingly, the various embodiments can be applicable to respective elements of any dimension, scaling, area, volume, distance, etc., and while a Figure may illustrate a dimension of one element rendered in association with another element, the respective dimensions, scaling, ratios, etc., are not limited to those as rendered but can be of any applicable magnitude.

What has been described above includes examples of the disclosed innovation. It is, of course, not possible to describe every conceivable combination of components or methodologies for purposes of describing the disclosed innovation, but one of ordinary skill in the art can recognize that many further combinations and permutations of the disclosed innovation are possible. Accordingly, the disclosed innovation is intended to embrace all such alterations, modifications and variations that fall within the spirit and scope of the appended claims. Furthermore, to the extent that the term "contain," "includes," "has," "involve," or variants thereof is used in either the detailed description or the claims, such term can be inclusive in a manner similar to the term "comprising" as "comprising" is interpreted when employed as a transitional word in a claim. The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

Further, while certain embodiments have been described above, it is to be appreciated that these embodiments have been presented by way of example only, and are not intended to limit the scope of the claimed subject matter. Indeed, the novel methods and devices described herein may be made without departing from the spirit of the above description. The accompanying claims and their equivalents are intended to cover such forms or modifications as would fall within the scope and spirit of the subject innovation.

In addition, it should be appreciated that while the respective methodologies provided above are shown and described as a series of acts for purposes of simplicity, such methodologies are not limited by the order of acts, as some acts can, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

What is claimed is:

1. A semiconductor device comprising:
    a fin field effect transistor (finFET) structure, the finFET structure comprising:
        a silicon substrate;
        a first fin formed on the silicon substrate, wherein the first fin has a needle-shaped profile;
            wherein the first fin has a first part under a gate, and a second part, which is continuous with the first part; the second part having a cross-sectional shape different from the first part, and wherein the second part has the needle-shaped profile, and
            a portion of the first part, which is at an interface with the second part, and is exposed resulting from a difference between the first part and the second part in cross-sectional shape, is covered with the doped layer at a vicinity of a top of the needle-shaped profile of the first fin;
        a second fin formed on the silicon substrate, wherein the first fin and second fin are formed on the same side of the silicon substrate with a trough located between the first fin and the second fin;
        a buffer layer formed epitaxially on the first fin, the second fin and the trough located between the first fin and the second fin; and
        a doped layer formed epitaxially on the buffer layer, wherein the doped layer covers the first fin and the second fin, and an upper surface of the doped layer has a substantially flat profile.

2. The semiconductor device of claim 1, wherein the needle-shaped profile of the first fin has a profile of an isosceles triangle.

3. The semiconductor device of claim 1, wherein the needle-shaped profile of the first fin comprises a first side and a second side, where a first edge of the first side and a first edge of the second side form a point of the needle-shaped profile, and a second edge of the first side and a second edge of the second side intersect the silicon substrate to form a triangular structure.

4. The semiconductor device of claim 1, wherein the buffer layer comprises at least one of a carbon silicon (Si:C) layer or a carbon-doped silicon germanium (SiGe:C) layer.

5. The semiconductor device of claim 1, wherein the buffer layer comprises a SiH4-based SiGe layer or a SiH4-based SiGeC layer.

6. The semiconductor device of claim 1, wherein the doped layer comprising phosphorus-doped silicon (Si:P).

7. The semiconductor device of claim 1, wherein the doped layer comprising a silicon-germanium-boron (SiGeB) compound or a silicon-germanium-boron-carbon (SiGeBC) compound.

8. The semiconductor device of claim 1, wherein the silicon substrate, the first fin, and the second fin comprises silicon aligned on a first plane disparate to a second plane utilized to epitaxially grow at least one of the buffer layer or the doped layer.

9. The semiconductor device of claim 8, wherein the first plane and second plane are selected such that formation of at least one of the buffer layer or the doped layer generates a stress in at least one of the substrate, first fin, or second fin.

10. The semiconductor device of claim 1, wherein substantially no buffer layer is formed on a top of the needle-shaped profile of the first fin and a needle-shaped profile of the second fin.

11. A semiconductor device comprising:
a fin field effect transistor (finFET) structure, the finFET structure comprising:
a silicon substrate;
a first fin formed on the silicon substrate, wherein the first fin has a needle-shaped profile, wherein the needle-shaped profile of the first fin has a profile of an isosceles triangle;
a second fin formed on the silicon substrate, wherein the second fin has a needle-shaped profile, wherein the needle-shaped profile of the second fin has a profile of an isosceles triangle, the first fin and second fin are formed on the same side of the silicon substrate with a trough located between the first fin and the second fin; and
a buffer layer formed epitaxially on the first fin: and the second fin and the trough located between the first fin and the second fin; and
a doped layer formed epitaxially on the buffer layer, wherein
each of the first fin and the second fin has a first part under a gate, and a second part, which is continuous with the first part; the second part having a cross-sectional shape different from the first part, and wherein the second part has the needle-shaped profile, and
a portion of the first part, which is at an interface with the second part, and is exposed resulting from a difference between the first part and the second part in cross-sectional shape, is covered with the doped layer at a vicinity of a top of the needle-shaped profile of the first fin and the second fin.

12. The semiconductor device of claim 11, wherein the silicon substrate, the first fin, and the second fin comprise silicon aligned on a first plane and growth of the buffer layer generates stress in at least one of the substrate, the first fin, or the second fin in a direction disparate to the first plane.

13. The semiconductor device of claim 11, wherein the first part of the first fin has the cross-sectional shape of a rectangular.

14. The semiconductor device of claim 11, wherein the doped layer covers the first fin and the second fin, and an upper surface of the doped layer has a substantially flat profile.

15. The semiconductor device of claim 14, wherein substantially no buffer layer is formed on the top of the needle-shaped profile of the first fin.

16. A method for forming a fin field effect transistor (finFET) semiconductor device comprising:
forming a silicon substrate;
forming a first fin and a second fin on the surface of the silicon substrate; wherein the first fin and second fin are formed on the same side of the silicon substrate with a trough located between the first fin and the second fin, and each of the first fin and the second fin has a needle-shaped profile, and
wherein the first fin has a first part under a gate, and a second part, which is continuous with the first part; the second part having a cross-sectional shape different from the first part, and wherein the second part has the needle-shaped profile, and
a portion of the first part, which is at an interface with the second part, and is exposed resulting from a difference between the first part and the second part in cross-sectional shape, is covered with the doped layer at a vicinity of a top of the needle-shaped profile of the first fin;
forming, epitaxially, a buffer layer on the first fin, the second fin and the trough located between the first fin and the second fin; and
forming, epitaxially, a doped layer on the buffer layer,
wherein the doped layer covers the first fin and the second fin, and an upper surface of the doped layer has a substantially flat profile.

17. The method of claim 16, wherein the silicon substrate, the first fin, and the second fin comprise silicon aligned on a first plane disparate to a second plane utilized to epitaxially grow at least one of the buffer layer or the doped layer, wherein the first plane and second plane are selected such that during forming of at least one of the buffer layer of the doped layer facilitates generating a stress in at least one of the substrate, the first fin, or the second fin.

18. The semiconductor device of claim 16, wherein substantially no buffer layer is formed on a top of the needle-shaped profile of the first fin and the second fin.

* * * * *